(12) United States Patent
Kirisawa

(10) Patent No.: US 8,169,049 B2
(45) Date of Patent: May 1, 2012

(54) SEMICONDUCTOR DEVICE WITH FUSE PORTION

(75) Inventor: Ryouhei Kirisawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 257 days.

(21) Appl. No.: 12/493,614

(22) Filed: Jun. 29, 2009

(65) Prior Publication Data

US 2010/0001397 A1    Jan. 7, 2010

(30) Foreign Application Priority Data

Jul. 1, 2008    (JP) .................................. 2008-172694

(51) Int. Cl.
*H01L 23/52* (2006.01)

(52) U.S. Cl. ........................................ 257/529; 257/723

(58) Field of Classification Search .................. 257/723, 257/259

See application file for complete search history.

(56) References Cited

U.S. PATENT DOCUMENTS

| | | | | |
|---|---|---|---|---|
| 5,978,265 | A * | 11/1999 | Kirisawa et al. | 365/185.17 |
| 6,404,035 | B1 * | 6/2002 | Wu | 257/529 |
| 6,734,549 | B2 * | 5/2004 | Takeoka et al. | 257/700 |
| 6,835,999 | B2 | 12/2004 | Omura et al. | |
| 6,876,594 | B2 * | 4/2005 | Griesmer et al. | 365/225.7 |
| 7,579,673 | B2 * | 8/2009 | Ohkubo et al. | 257/665 |
| 7,615,409 | B2 * | 11/2009 | Yu et al. | 438/107 |
| 7,633,100 | B2 * | 12/2009 | Cho et al. | 257/256 |
| 7,709,898 | B2 * | 5/2010 | Takahashi | 257/357 |
| 2006/0203558 | A1 * | 9/2006 | Tanaka et al. | 365/185.19 |
| 2006/0289898 | A1 | 12/2006 | Kono et al. | |
| 2007/0007621 | A1 * | 1/2007 | Omura et al. | 257/529 |
| 2007/0210414 | A1 | 9/2007 | Iwamoto et al. | |
| 2007/0262414 | A1 | 11/2007 | Ueda | |
| 2007/0278580 | A1 | 12/2007 | Kondo et al. | |
| 2008/0316696 | A1 * | 12/2008 | Nishiyama et al. | 361/684 |

FOREIGN PATENT DOCUMENTS

| | | |
|---|---|---|
| JP | 6-139915 | 5/1994 |
| JP | 2007-305693 | 11/2007 |
| JP | 2008-53342 | 3/2008 |

OTHER PUBLICATIONS

H. Takaoka, et al., "A Novel Via-fuse Technology Featuring Highly Stable Blow Operation with Large On-off Ratio for 32nm Node and Beyond", International Electron Devices meeting 2007 Technical Digest, Dec. 2007, pp. 43-46.

* cited by examiner

*Primary Examiner* — Matthew Landau
*Assistant Examiner* — Robert Bachner
(74) *Attorney, Agent, or Firm* — Oblon, Spivak, McClelland, Maier & Neustadt, L.L.P.

(57) ABSTRACT

A semiconductor device includes: a plurality of NAND memory dies each including: a first wiring layer formed in the NAND memory die; a second wiring layer formed in the NAND memory die; a first insulation layer formed between the first wiring layer and the second wiring layer; and a first interlayer connector formed in the first insulation layer, a controller configured to control the NAND memory dies; a package housing the NAND memory dies and the controller; a connecting portion electrically connecting an inner side of the package and an outer side of the package; a first connecting wire; and a second connecting wire, wherein a resistance value per unit length of the first interlayer connector is larger than a resistance value per unit length of the first wiring layer, and wherein the first interlayer connector is cut off when a first current flows through the first interlayer connector.

23 Claims, 7 Drawing Sheets

SEMICONDUCTOR DEVICE WITH FUSE PORTION

CROSS-REFERENCE TO RELATED APPLICATIONS

This application is based upon and claims the benefit of priority from Japanese Patent Application No. 2008-172694, filed Jul. 1, 2008, the entire contents of which are incorporated herein by reference.

BACKGROUND

1. Field

The present invention relates to a semiconductor device, and more particularly, to a semiconductor device having a plurality of wiring layers.

2. Description of the Related Art

JP-A-6-139915 discloses a semiconductor device that is provided with a fuse portion using an aluminum-based internal wiring, in which the fuse portion is melted and cut off, thereby rapidly cutting off current with high reliability.

JP-A-2008-53342 discloses a protection device to protect a semiconductor circuit. When low-voltage overcurrent flows, a fuse is melted and cut off to protect the semiconductor circuit. When little-current overvoltage is applied, a short circuit occurs at a semiconductor junction portion to protect the semiconductor circuit.

SUMMARY OF THE INVENTION

According to an aspect of the present invention, there is provided a semiconductor device including: a plurality of NAND memory dies each including: a first wiring layer formed in the NAND memory die, including a first connecting portion; a second wiring layer formed in the NAND memory die inner than the first wiring layer; a first insulation layer formed between the first wiring layer and the second wiring layer to insulate the first wiring layer and the second wiring layer; and a first interlayer connector formed in the first insulation layer to electrically connect the first wiring layer and the second wiring layer; a controller configured to control the NAND memory dies; a package housing the NAND memory dies and the controller; a connecting portion electrically connecting an inner side of the package and an outer side of the package; a first connecting wire connecting the connecting portion and the first connecting portion; and a second connecting wire connecting the connecting portion and the controller, wherein a resistance value per unit length of the first interlayer connector is larger than a resistance value per unit length of the first wiring layer, and wherein the first interlayer connector is cut off when a first current having a first condition flows through the first interlayer connector.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Hereinafter, embodiments of the invention will be described with reference to the drawings. A memory card is an example of a semiconductor device according to the embodiments of the invention, wherein like numbers reference like elements and overlapping description is omitted in the embodiments.

First Embodiment

Figure 1A:
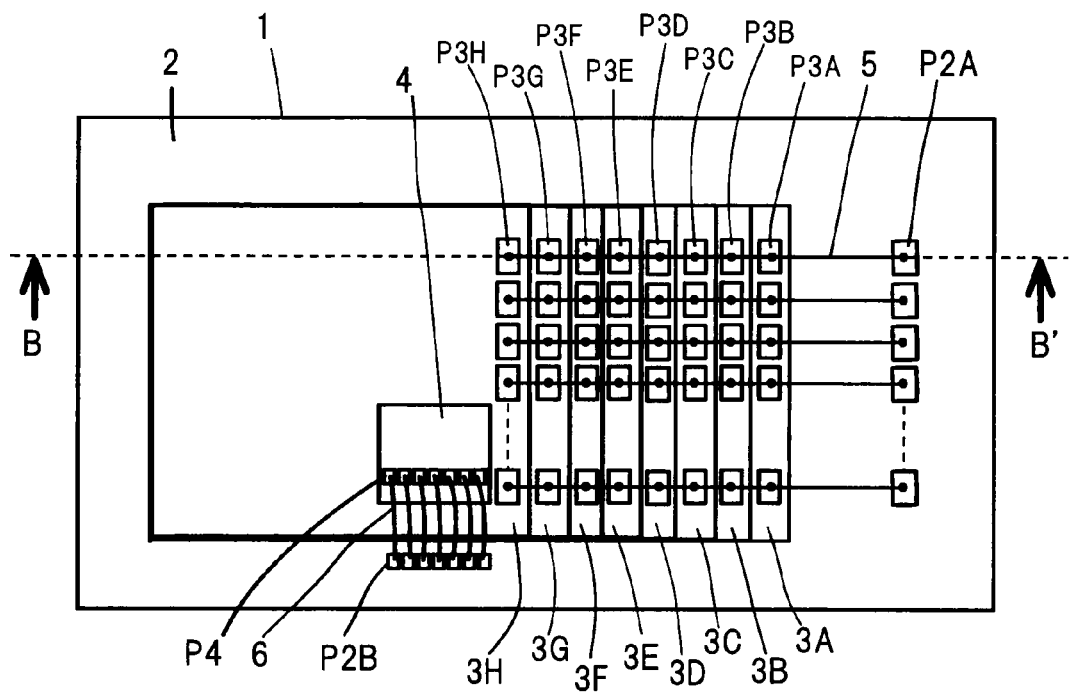
FIG. 1A is a plane view illustrating a memory card according to a first embodiment.
Figure 1B:
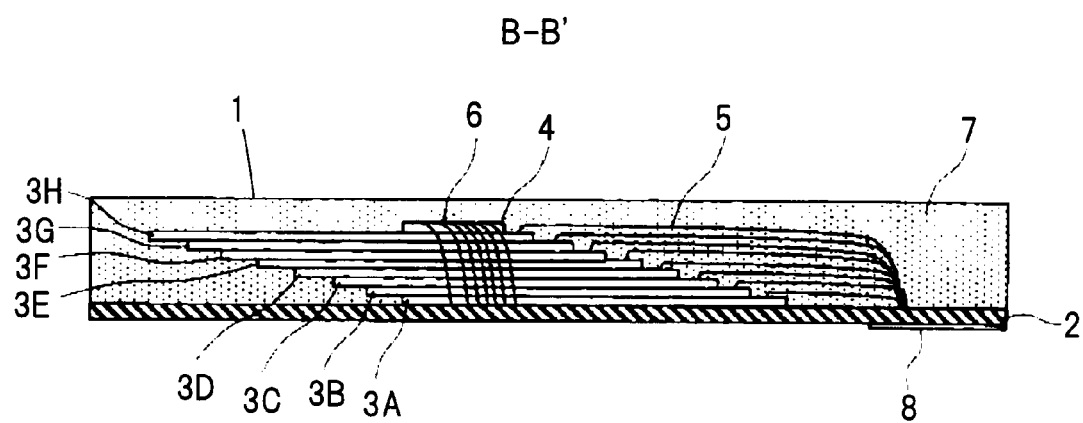
FIG. 1B is a cross-sectional view of FIG. 1A taken through line BB' of FIG. 1A.

FIG. 1A is a plane view illustrating the memory card according to a first embodiment. FIG. 1B is a cross-sectional view of FIG. 1A taken through line BB' of FIG. 1A. As shown in FIGS. 1A and 1B, the memory card 1 includes a substrate 2, a plurality of NAND memory chips 3A to 3H laminated and mounted on the substrate 2, a controller chip 4 laminated and mounted on the NAND memory chip 3H.

Pads P3A to P3H are provided on upper surfaces of right ends of the NAND memory chips 3A to 3H in FIG. 1A, and pads P2A and P2B are provided on upper surfaces of a right end and a center of the substrate 2 in FIG. 1A. These pads P2A and P2B are electrically connected to bonding wires 5 and 6. The NAND memory chips 3A to 3H are laminated with steps to expose the pads. The memory card 1 is sealed up by a resin mold 7 to cover the NAND memory chips 3A to 3H, the controller chip 4, and the bonding wires 5 and 6 on the substrate 2. The memory card 1 is integrally formed in a card shape by the resin mold 7. The memory card 1 is inserted into a memory card slot of a mobile electronic apparatus such as a mobile phone, a mobile information terminal, and a mobile personal computer and is connected thereto. For this reason, a connection terminal 8 is provided at a right end on a lower surface of the substrate 2, which is not sealed up by the resin mold 7 shown in FIG. 1B.

For example, there is an SD card as a memory card used in such a mobile electronic apparatus. A capacity of the SD card is getting larger and a size of the SD card is getting smaller to cope with a small-size and high-function mobile electronic apparatus. The SD card has three types of external shapes such as an SD memory card, a miniSD card (Trademark), and a microSD card (Trademark) in order of size. Particularly, the microSD card has an external size such as width: 11 mm, length: 15 mm, thickness: 1.0 mm, a volume of which is about ⅒ of the volume of the SD memory card and about ¼ of the volume of the miniSD card. As described above, the size of the microSD card is small and thin, and thus the microSD card has been widely used as an expansion memory of a mobile phone or the like.

The NAND memory chips 3A to 3H are formed in a thin board shape, in which a NAND flash memory, a peripheral circuit, and the like are sealed up by resin mold or the like. The controller chip 4 is formed in a thin board shape, in which control circuits for controlling operations of the NAND memory chips 3A to 3H and the like are sealed up by resin mold or the like.

According to the first embodiment, the memory card 1 prevents overcurrent from flowing.

Figure 2:
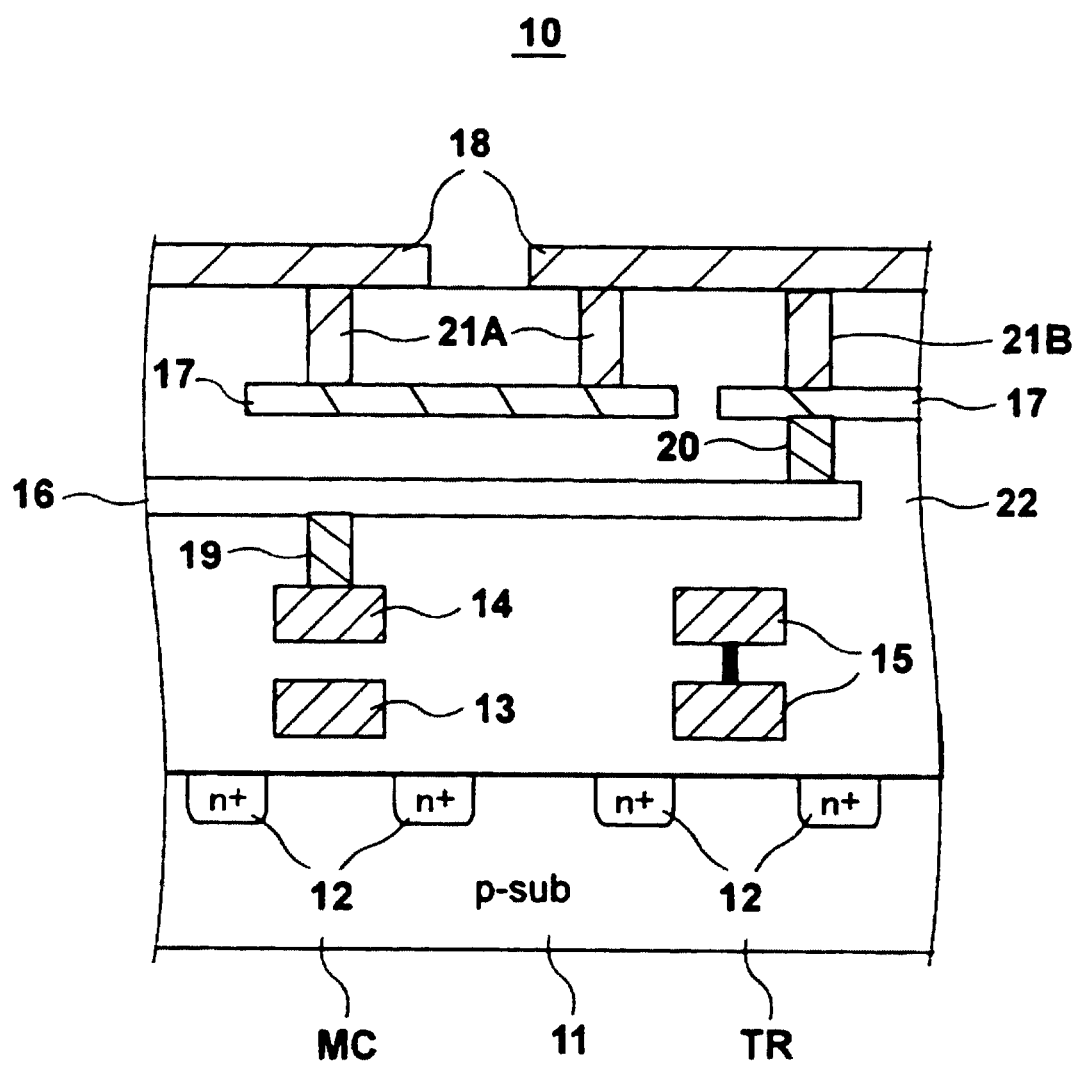
FIG. 2 is a cross-sectional view illustrating a part of a memory cell constituting a memory cell array in a NAND memory chip according to the first embodiment.

FIG. 2 is a cross-sectional view illustrating a part of a memory cell constituting a memory cell array 10 in the NAND flash memory mounted on the NAND memory chips 3A to 3H. As shown in FIG. 2, the memory cell array 10 includes a memory cell MC (active element), a peripheral transistor TR (e.g., drain side selection gate transistor, active element) for driving the memory cell MC, and wiring layers 15 to 17 for electrically connecting the memory cell MC and the peripheral transistor TR to a peripheral circuit. A process for producing the memory cell array 10 will be described hereinafter.

The memory cell MC is formed in a build-up structure including an n type source and drain diffusion layer 12 formed on a p type well substrate 11, a floating gate 13, and a control gate 14. The peripheral transistor TR is formed in a build-up structure including the n type source and drain diffusion layer 12 formed on the p type well substrate 11, and a gate electrode 15.

As shown in FIG. 2, when the wiring layers 16 to 18 are formed in three layers, the floating gate 13 and the control gate 14 of the memory cell MC, the gate electrode 15 of the peripheral transistor TR, or a part of wiring layers if necessary are formed of polycrystalline silicon p-Si, tungsten silicide WSi2, or the like. Subsequently, an interlayer insulating film 22 is formed thereon. Then, a desired contact hole 19 for electrically connecting the first wiring layer 16 to the n type diffusion area formed on the p type well substrate 11 and a part of wiring layers or the gate electrode 15 is formed at a predetermined position on the interlayer insulating film 22 by RIE (Reactive Ion Etching) or the like. Then, the first wiring layer 16 is formed of, for example, tungsten W, and the contact hole 19 is embedded in tungsten W. As a result, the control gate 14 and the wiring layer 15 are electrically connected to each other. Then, a first-layer wiring is formed by a patterning process.

Subsequently, a second interlayer insulating film 22 is formed, and a contact hole 20 for electrically connecting the first wiring layer 16 to the second wiring layer 17 formed above the first wiring layer 16 is formed at a predetermined position on the second interlayer insulating film 22 by the RIE (Reactive Ion Etching) or the like. Then, the second wiring layer 17 is formed of, for example, copper Cu. The contact hole 20 is embedded in copper Cu of the second wiring layer 17 in the same manner as in the case of the first wiring layer 16.

Figure 3:
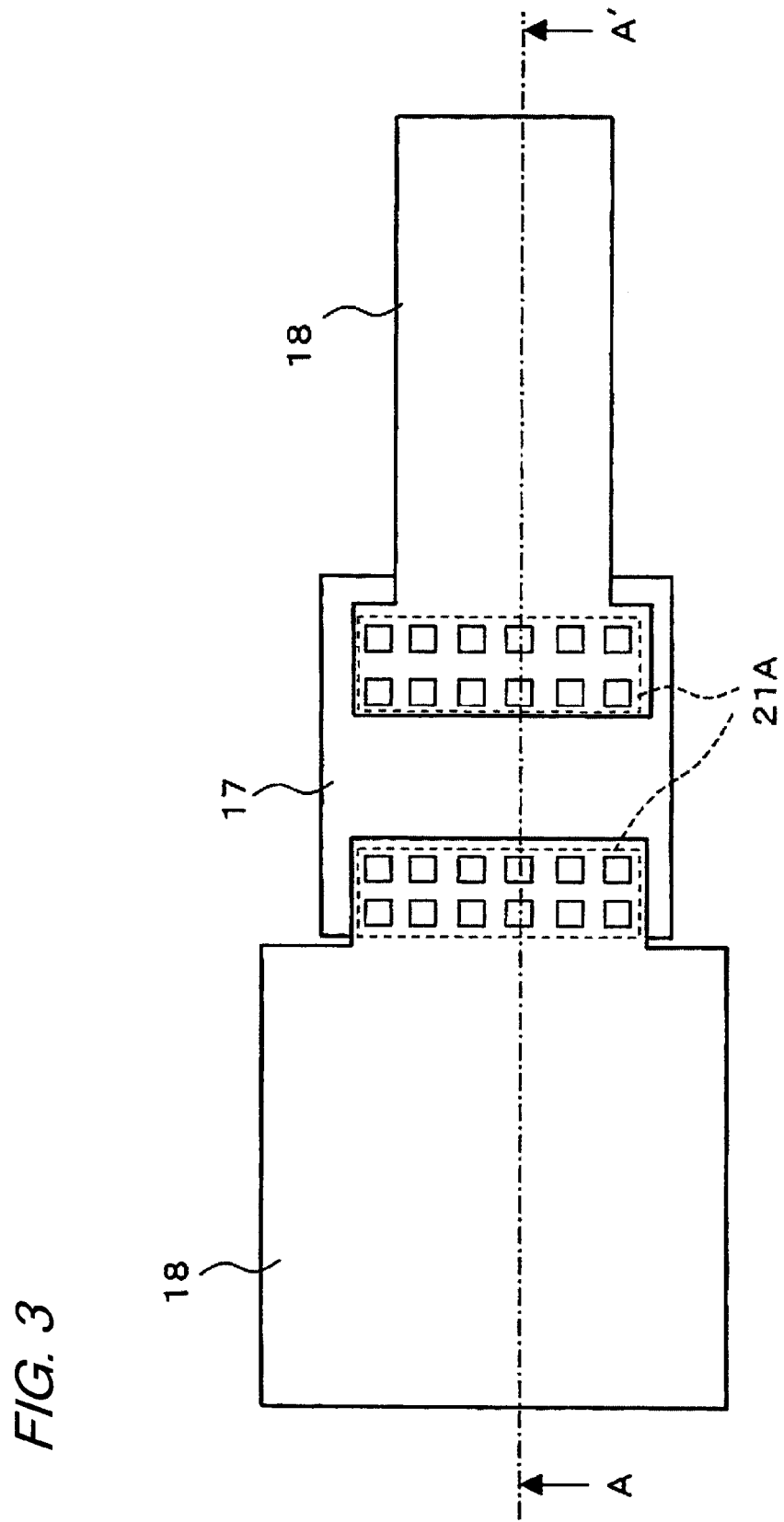
FIG. 3 is a plan view illustrating a second wiring layer, a third wiring layer, and contact holes according to the first embodiment.
Figure 4:
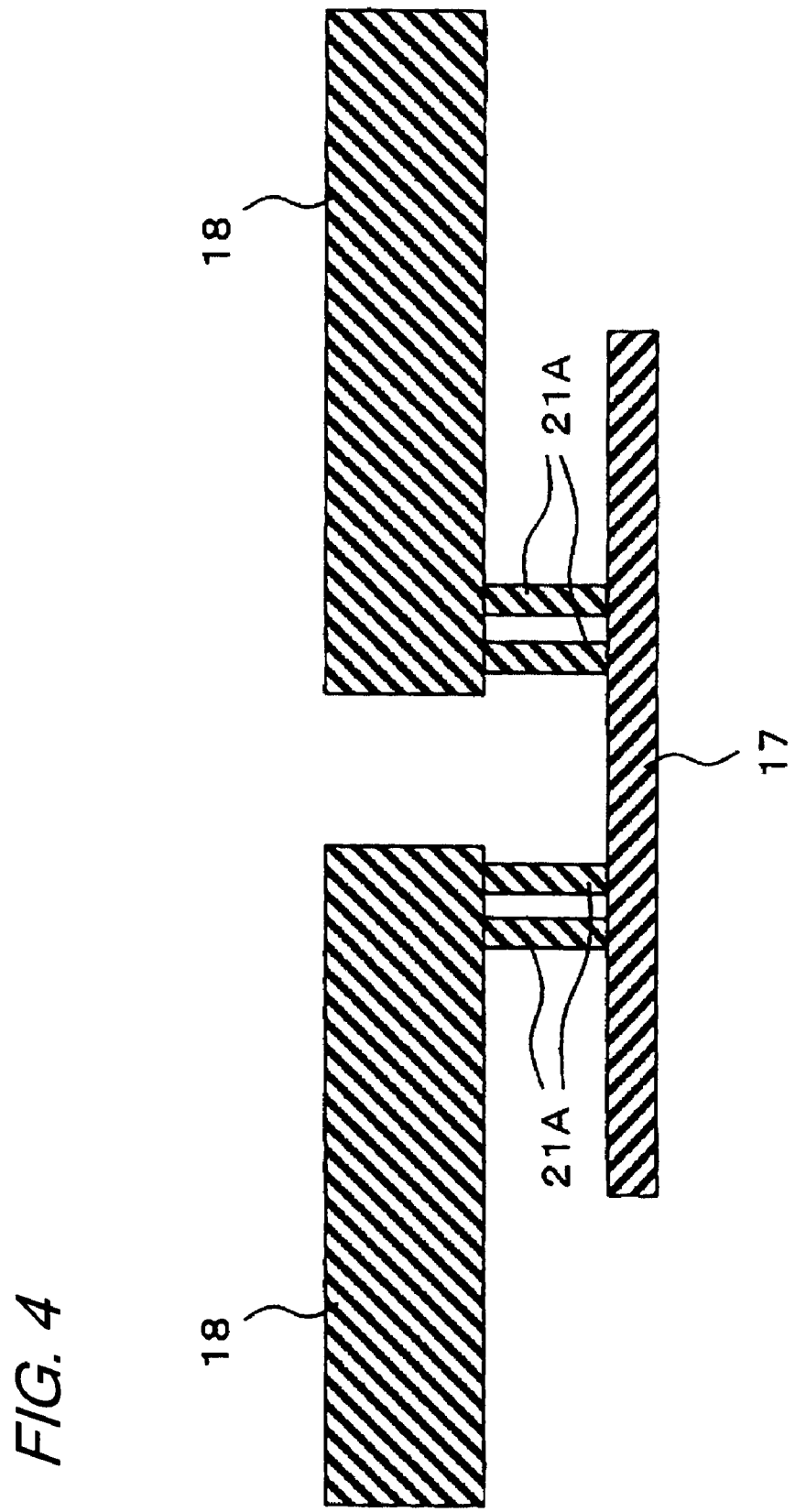
FIG. 4 is a cross-sectional view taken along Line A-A' shown in FIG. 3 according to the first embodiment.

Then, a wiring for substituting a part of the third wiring layer 18 that is the top layer is formed of the second wiring layer 17 at the time of performing a patterning process of the second wiring layer 17. Subsequently, a third interlayer insulating film 22 is formed on the second wiring layer 17, and contact holes 21A and 21B for connecting the second wiring layer 17 to a third wiring layer 18 to be formed later are formed by the RIE or the like. At this time, a plurality of contact holes 21A are formed on the second wiring layer 17 (second area) for substituting the third wiring layer 18, so as to be melted and cut off at a predetermined time and a predetermined current. The contact hole 21A (high resistance) serves as a fuse. An opening area of the contact holes 21A serving as the fuse may be adjusted, or a plurality of contact holes 21A having a predetermined area may be formed. When the size of the contact hole is regular, a condition of cut off by current per a contact hole is calculated and a plurality of contact holes 21A may be formed to be melted and cut off at a necessary amount of current and a predetermined time as shown in FIG. 3 and FIG. 4.

Figure 7:
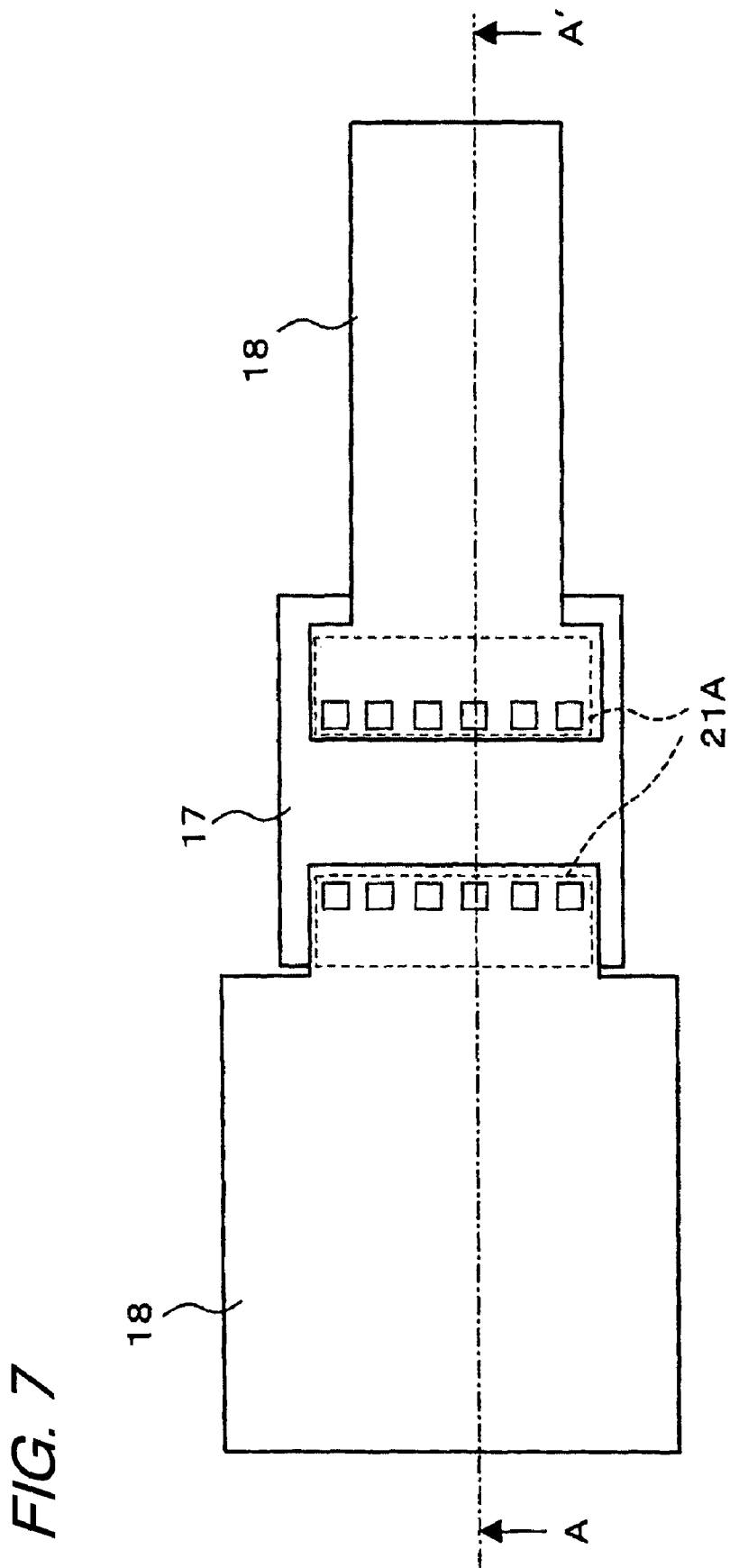
FIG. 7 is a plan view illustrating a second wiring layer, a third wiring layer, and contact holes according to the first embodiment.

Even if the contact hole is designed to be formed on the interlayer insulating film 22 by RIE, the number of contact holes is adjustable by masking the opening operation of RIE, and the condition of cut off is also adjustable. FIG. 7 shows an example that a half of contact holes are masked. The contact holes in FIG. 7 are easier to be melted and cut off than the contact holes in FIG. 3.

After the contact holes 21A and 21B are formed, the third wiring layer 18 is formed of, for example, aluminum alloy, and the contact hole 21 is embedded in the aluminum alloy. Then, for example, an external connection terminal (not shown) for input and output of signals or reception and supply of electrical power from and to an external device and wiring is formed at an end of a third-layer wiring as shown in FIG. 3 and FIG. 4.

In a wiring requiring a fuse, it is necessary to connect the fuse in series, and thus a part of the third wiring layer 18 is divided into two areas (first area, third area) in FIG. 2. The two areas of the divided third wiring layer 18 are connected to each other through a second-layer wiring and the contact holes 21A for electrically connecting the second wiring layer 17. Since the contact holes 21A having the fuse function only needs to be electrically connected to the second-layer wiring, the wiring after forming the contact holes 21A may be performed with the second wiring layer 17. That is, the second wiring layer 17 is divided at a position for forming the contact holes 21A. Accordingly, the contact hole 21B is a general contact hole having no fuse function. In the first embodiment, since electrical resistance per a unit length of the third-layer wiring is lower than electrical resistance per a unit length of the second-layer wiring, a part between the divided third-layer wirings is substituted by the second-layer wiring.

In this case, electrical resistance of the second-layer wiring for substituting a part of the third-layer wiring is designed lower than electrical resistance of the contact holes 21A. In the first embodiment, the contact holes 21A become a high resistance wiring area. Then, a patterning process is performed on the third wiring layer 18, thereby forming the connection terminal and the wiring at the third layer. Subsequently, the interlayer insulating film 22 is formed, and an insulating film on the connection terminal is removed.

As described above, it is conceivable that overcurrent flows at a part of the NAND memory chips 3A to 3H of the memory card 1. In this case, when the amount of overcurrent is larger than permeable current of the contact holes 21A having the fuse function, the contact holes 21A are melted and cut off, thereby cutting off the input and output of signals or the reception and supply of electrical power from and to the external device.

As a result, it is possible to improve reliability of the microSD card by applying the configuration of the memory card 1 according to the first embodiment to the above-described small and thin microSD card or the like.

Second Embodiment

A second embodiment of the invention is an example of modifying a mount position of the contact hole having the fuse function in NAND memory chips mounted on the memory card 1 according to the first embodiment.

Figure 5:
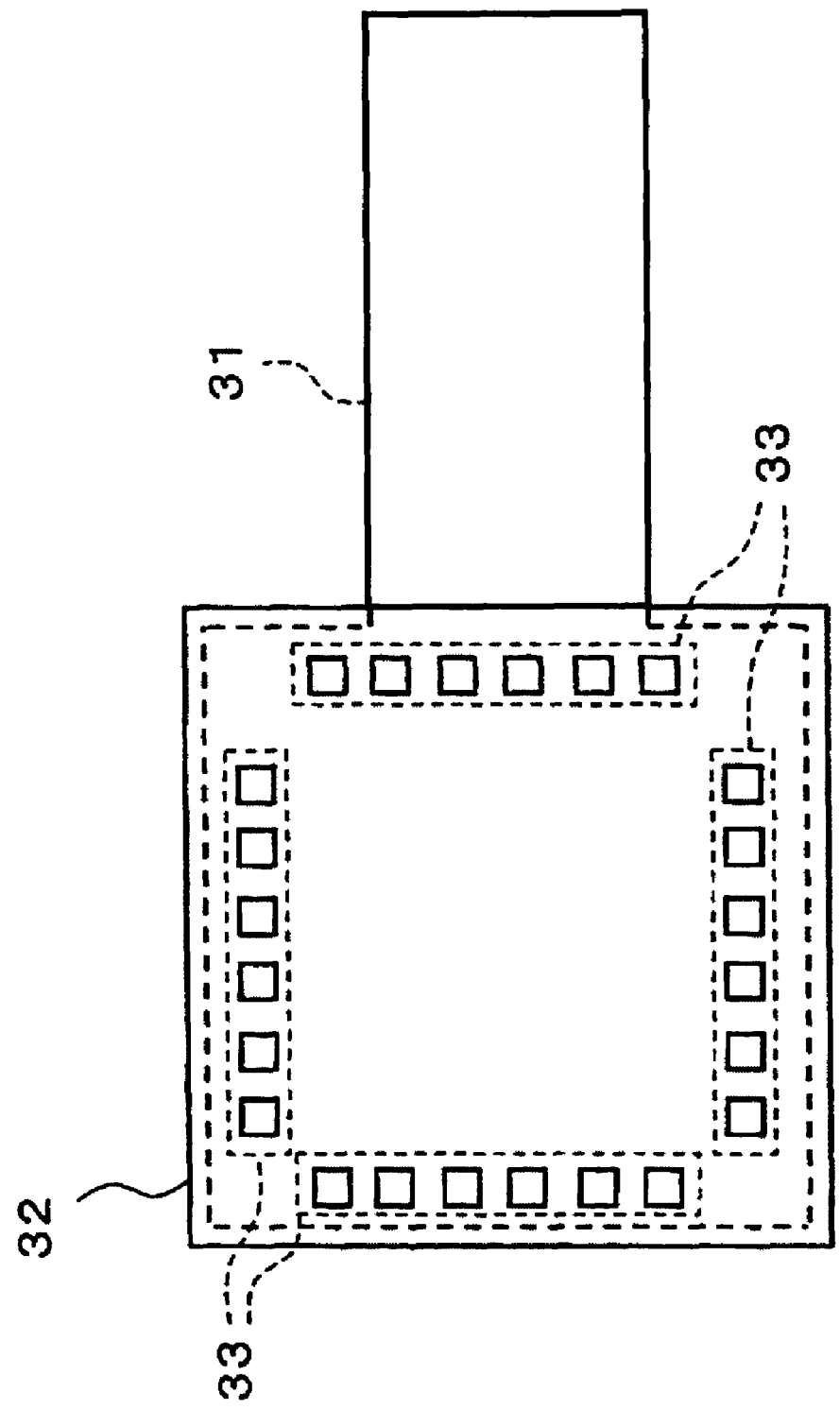
FIG. 5 is a plan view illustrating a second-layer wiring, a third-layer wiring, and contact holes in a NAND memory chip according to a second embodiment.

FIG. 5 is a plan view illustrating a second-layer wiring 31, a third-layer wiring 32, contact holes 33 in the NAND memory chips according to the second embodiment. In this case, the third-layer wiring 32 is formed as a connection terminal. A plurality of contact holes 33 are formed under the connection terminal.

The second-layer wiring 31 is formed of, for example, copper Cu, and the third-layer wiring 32 is formed of, for example, aluminum alloy (AlCu). The contact holes 33 are embedded in the aluminum alloy (AlCu). The contact holes 33 electrically connect the second-layer wiring 31 and the third-layer wiring 32 formed as the connection terminal to each other. To serve as a fuse, opening areas and the number of the contact holes 33 are adjusted to be melted and cut off at a necessary amount of current and a predetermined time as described above. Electrical resistance of the third-layer wiring 32 is designed lower than electrical resistance of the second-layer wiring 31, and the electrical resistance of the second-layer wiring 31 is designed lower than electrical resistance of the contact holes 33.

In the second embodiment, as shown in FIG. 5, the plurality of contact holes 33 having the fuse function are formed under the third-layer wiring 32 formed as the connection terminal. With such a configuration, the contact holes 33 are melted and cut off and thus the reception and supply of electrical power or the input and output of signals from and to the external device are cut off, when the amount of current is larger than permeable current of the contact holes 33 having the fuse function. The configuration of the fuse function of the contact holes 33 is applicable to the controller chip in the same manner. The contact holes have the fuse function in the first and second embodiments, but an area having the fuse function may be formed in the second wiring layer connected to the third wiring layer through the contact holes. In this case, the area having the fuse function is designed with a length and a width to be melted and cut off at a necessary amount of current and a predetermined time.

Third Embodiment

A third embodiment of the invention is an example of processing a part of the wiring to form a fuse in the NAND memory chips mounted on the memory card 1 according to the first embodiment.

Figure 6:
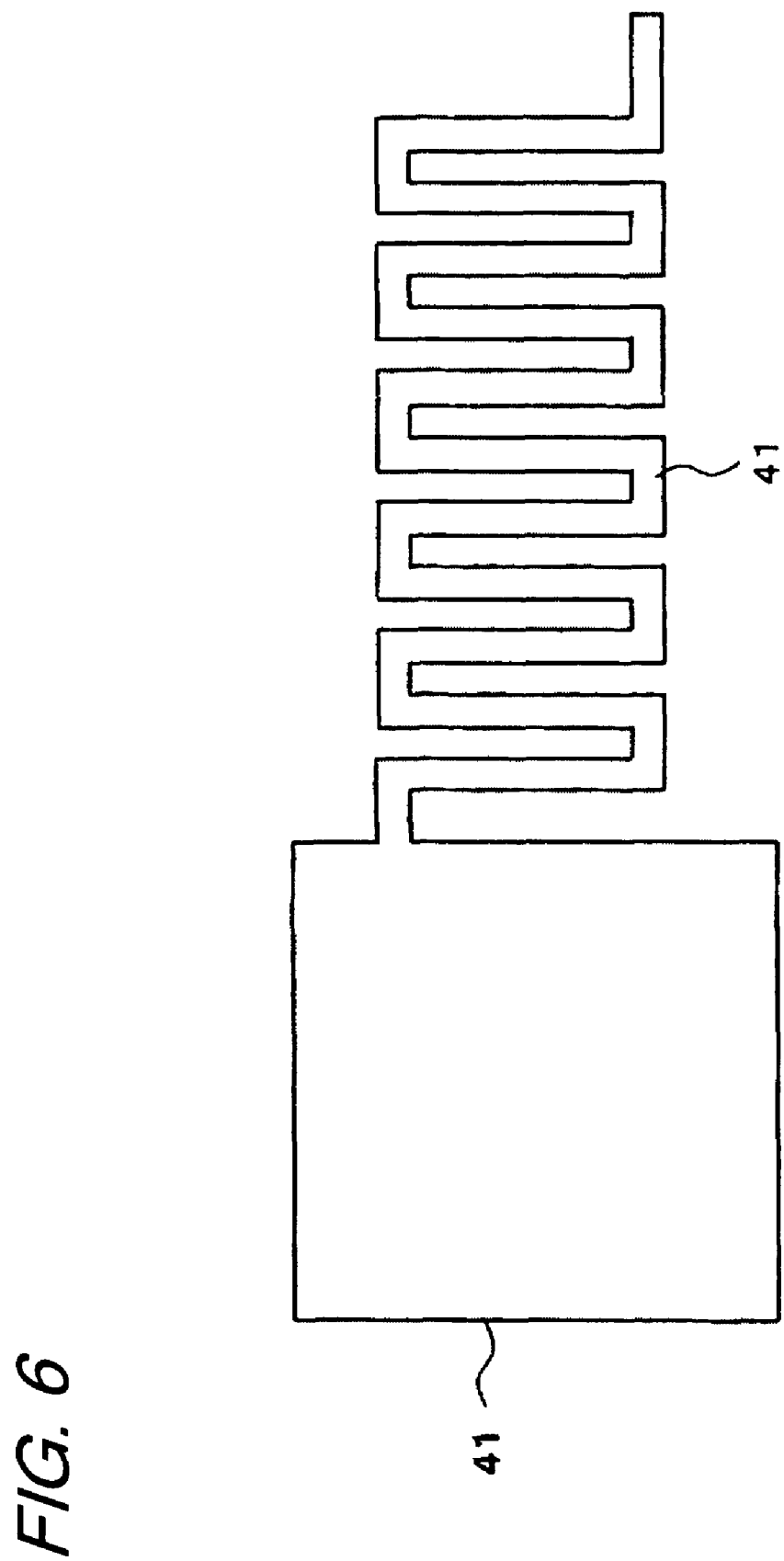
FIG. 6 is a plan view illustrating a third-layer wiring in a NAND memory chip according to a third embodiment.

FIG. 6 is a plan view illustrating a third-layer wiring 41 in NAND memory chips according to the third embodiment. In this case, the third-layer wiring 41 has a part formed as a connection terminal and a part formed as a fuse. A length and a width of the part formed as the fuse is formed to be melted and cut off at a necessary amount of current and a predetermine time.

In the third embodiment, as shown in FIG. 6, a part of the third-layer wiring 41 is formed as the fuse. With such a configuration, the third-layer wiring 41 formed as the fuse is melted and cut off and thus the reception and supply of electrical power or the input and output of signals to and from the external device are cut off, when the amount of current is larger than permeable current of the third-layer wiring 41 formed as the fuse. The configuration of the fuse function of a part of the wiring is also applicable to the controller chip in the same manner.

The forming position and the number of the contact holes having the fuse function described in the first embodiment and the second embodiment, and the third-layer wiring formed as the fuse described in the third embodiment are merely examples. The forming position and the number of contact holes, and specifications of the wiring formed as the fuse may be appropriately modified according to operation current flowing in the memory chips mounted on the memory card.

The approximate size of the memory card 1 is merely an example of applying the memory card 1 to the microSD card. For example, when the memory card 1 is applied to the SD memory card or the miniSD card, the approximate size of the memory card 1 may be appropriately modified according to external sizes. In addition, the approximate size of the memory card 1 may be appropriately modified according to external sizes of memory cards based on another standard. The number of laminated chips in the memory chip described in the first embodiment by way of example is merely an example, and the invention is not limited to these constituent requirements.

As described with reference to the above embodiments, there is provided a semiconductor device capable of cutting off overcurrent flowing in a circuit formed in the semiconductor chip.

What is claimed is:

1. A semiconductor device comprising:
a plurality of memory dies each comprising:
a first wiring layer comprising a first connecting portion;
a second wiring layer;
a first insulation layer formed between the first wiring layer and the second wiring layer to insulate the first wiring layer and the second wiring layer; and
a first interlayer connector having a fuse function disposed in a first contact hole formed through the first insulation layer to electrically connect the first wiring layer and the second wiring layer;
a controller configured to control the memory dies;
a package housing the memory dies and the controller;
a connecting portion electrically connecting an inner side of the package and an outer side of the package;
a first connecting wire connecting the connecting portion and the first connecting portion; and
a second connecting wire connecting the connecting portion and the controller,
wherein a resistance value per unit length of the first interlayer connector is larger than a resistance value per unit length of the first wiring layer, and
wherein the first interlayer connector is cut off in the contact hole if a first current exceeding a threshold current flows through the first interlayer connector.

2. The semiconductor device according to claim 1 further comprising a substrate on which the connecting portion is formed, the substrate being housed in the package,
wherein the memory dies are vertically stacked on the substrate, and
wherein the controller is stacked on a top face of the stacked memory dies.

3. The semiconductor device according to claim 2, wherein the semiconductor device conforms to a micro SD standard.

4. The semiconductor device according to claim 2, wherein the semiconductor device conforms to a mini SD standard.

5. The semiconductor device according to claim 1, wherein the connecting portion supplies electrical power from the outside of the package to the memory dies and the controller.

6. The semiconductor device according to claim 1, wherein the connecting portion receives an electrical signal from the outside of the package, and outputs the electrical signal to the outer side of the package.

7. The semiconductor device according to claim 1, wherein the first wiring layer and the first interlayer connector are made of aluminum alloy.

8. The semiconductor device according to claim 7, wherein the aluminum alloy is AlCu.

9. The semiconductor device according to claim 3, wherein the memory dies are NAND memory dies.

10. The semiconductor device according to claim 5, wherein the first wiring layer and the first interlayer connector are made of aluminum alloy.

11. The semiconductor device according to claim 10, wherein the aluminum alloy is AlCu.

12. The semiconductor device according to claim 5,
further comprising a substrate on which the connecting portion is formed, the substrate being housed in the package,
wherein the memory dies are vertically stacked on the substrate, and
wherein the controller is stacked on a top face of the stacked memory dies.

13. The semiconductor device according to claim 12, wherein the semiconductor device conforms to a micro SD standard.

14. The semiconductor device according to claim 13, wherein the memory dies are NAND memory dies.

15. The semiconductor device according to claim 6, further comprising a substrate on which the connecting portion is formed, the substrate being housed in the package,
wherein the memory dies are vertically stacked on the substrate, and
wherein the controller is stacked on a top face of the stacked memory dies.

16. The semiconductor device according to claim 15, wherein the semiconductor device conforms to a micro SD standard.

17. The semiconductor device according to claim 16, wherein the memory dies are NAND memory dies.

18. The semiconductor device according to claim 6, wherein the first wiring layer and the first interlayer connector are made of aluminum alloy.

19. The semiconductor device according to claim 18, wherein the aluminum alloy is AlCu.

20. The semiconductor device according to claim 8, wherein the memory dies are NAND memory dies.

21. A semiconductor device comprising:
a plurality of memory dies each comprising:
a first wiring layer comprising a first connecting portion;
a second wiring layer;
a first insulation layer formed between the first wiring layer and the second wiring layer to insulate the first wiring layer and the second wiring layer; and
a first interlayer connector having a fuse function disposed in a first contact hole formed through the first insulation layer to electrically connect the first wiring layer and the second wiring layer;
a controller configured to control the memory dies;
a package housing the memory dies and the controller;
a connecting portion electrically connecting an inner side of the package and an outer side of the package;
a first connecting wire connecting the connecting portion and the first connecting portion; and
a second connecting wire connecting the connecting portion and the controller,
wherein a resistance value per unit length of the first interlayer connector is larger than a resistance value per unit length of the first wiring layer, and
wherein the first interlayer connector is melted in the contact hole if a first current exceeding a threshold current flows through the first interlayer connector.

22. The semiconductor device according to claim 1, wherein the first interlayer comprises a fuse.

23. A semiconductor device comprising:
a plurality of memory dies each comprising:
a first wiring layer comprising a first connecting portion;
a second wiring layer;
a first insulation layer formed between the first wiring layer and the second wiring layer to insulate the first wiring layer and the second wiring layer; and
a first interlayer connector having a fuse function disposed in a first contact hole formed through the first insulation layer to electrically connect the first wiring layer and the second wiring layer;
a controller configured to control the memory dies;
a package housing the memory dies and the controller;
a connecting portion electrically connecting an inner side of the package and an outer side of the package;
a first connecting wire connecting the connecting portion and the first connecting portion; and
a second connecting wire connecting the connecting portion and the controller; wherein
a resistance value per unit length of the first interlayer connector is larger than a resistance value per unit length of the first wiring layer,
the first interlayer connector is cut off if a first current exceeding a threshold current flows through the first interlayer connector,
said first contact hole has upper and lower openings arranged vertically over each other,
said interlayer connector is directly connected to the first wiring layer at said lower opening, and
said interlayer connector is directly connected to said second wiring layer at said upper opening.

* * * * *